(12) United States Patent
Chang et al.

(10) Patent No.: US 9,548,245 B2
(45) Date of Patent: *Jan. 17, 2017

(54) ISOLATION RINGS FOR PACKAGES AND THE METHOD OF FORMING THE SAME

(71) Applicant: Taiwan Semiconductor Manufacturing Company, Ltd., Hsin-Chu (TW)

(72) Inventors: Chih-Horng Chang, Taipei (TW); Tin-Hao Kuo, Hsin-Chu (TW); Tsung-Fu Tsai, Changhua (TW); Min-Feng Ku, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/724,954

(22) Filed: May 29, 2015

(65) Prior Publication Data

US 2015/0262882 A1    Sep. 17, 2015

Related U.S. Application Data

(60) Continuation of application No. 14/189,584, filed on Feb. 25, 2014, now Pat. No. 9,048,333, which is a (Continued)

(51) Int. Cl.
*H01L 21/78* (2006.01)
*H01L 23/00* (2006.01)
(Continued)

(52) U.S. Cl.
CPC ............. *H01L 21/78* (2013.01); *H01L 21/304* (2013.01); *H01L 21/56* (2013.01); *H01L 21/561* (2013.01);
(Continued)

(58) Field of Classification Search
CPC ........ H01L 21/78; H01L 21/565; H01L 23/00; H01L 21/561; H01L 24/97; H01L 21/304; H01L 23/564
See application file for complete search history.

(56) References Cited

U.S. PATENT DOCUMENTS 5,053,378 A    10/1991   Blanchard et al.
5,173,766 A    12/1992   Long et al.
(Continued)

FOREIGN PATENT DOCUMENTS

TW    I307951        3/2009
TW    201125097      7/2011

*Primary Examiner* — Mohsen Ahmadi
*Assistant Examiner* — Gustavo Ramallo
(74) *Attorney, Agent, or Firm* — Slater Matsil, LLP

(57) ABSTRACT

A device includes a first package component, and a second package component underlying, and bonded to, the first package component. A molding material is disposed under the first package component and molded to the first and the second package components, wherein the molding material and the first package component form an interface. An isolation region includes a first edge, wherein the first edge of the isolation region contacts a first edge of the first package component and a first edge of the molding material. The isolation has a bottom lower than the interface.

20 Claims, 12 Drawing Sheets

Related U.S. Application Data division of application No. 13/485,527, filed on May 31, 2012, now Pat. No. 8,710,681.

(51) Int. Cl.
*H01L 21/82* (2006.01)
*H01L 21/56* (2006.01)
*H01L 21/304* (2006.01)
*H01L 23/31* (2006.01)

(52) U.S. Cl.
CPC ............ *H01L 21/565* (2013.01); *H01L 21/82* (2013.01); *H01L 23/3135* (2013.01); *H01L 23/564* (2013.01); *H01L 24/97* (2013.01); H01L 23/3121 (2013.01); H01L 2224/16225 (2013.01); H01L 2924/12042 (2013.01); H01L 2924/181 (2013.01); H01L 2924/1815 (2013.01)

(56) References Cited

U.S. PATENT DOCUMENTS

| | | | |
|---|---|---|---|
| 5,570,502 A | 11/1996 | Sawtell et al. | |
| 6,153,528 A * | 11/2000 | Lan | H01L 21/7681 257/E21.579 |
| 6,249,039 B1 | 6/2001 | Harvey et al. | |
| 6,338,980 B1 * | 1/2002 | Satoh | H01L 21/561 257/E21.508 |
| 7,629,660 B2 | 12/2009 | Bauer et al. | |
| 7,980,828 B1 | 7/2011 | Lantz et al. | |
| 8,169,083 B2 | 5/2012 | Igarashi | |
| 8,418,358 B2 | 4/2013 | Wada | |
| 8,455,301 B2 * | 6/2013 | Lee | H01L 21/561 257/622 |
| 2003/0227025 A1 | 12/2003 | Ochi et al. | |
| 2004/0077121 A1 | 4/2004 | Maeda et al. | |
| 2005/0208684 A1 | 9/2005 | Yamada et al. | |
| 2008/0251946 A1 | 10/2008 | Seko | |
| 2009/0001606 A1 * | 1/2009 | Tamadate | H01L 21/563 257/778 |
| 2009/0163615 A1 | 6/2009 | Halahmi et al. | |
| 2009/0323162 A1 | 12/2009 | Fanton et al. | |
| 2010/0019371 A1 | 1/2010 | Shiota et al. | |
| 2010/0044853 A1 | 2/2010 | Dekker et al. | |
| 2012/0129301 A1 * | 5/2012 | Or-Bach | G11C 8/16 438/129 |
| 2012/0261689 A1 | 10/2012 | Appelt et al. | |
| 2012/0264257 A1 * | 10/2012 | Lee | H01L 24/50 438/113 |
| 2013/0175659 A1 | 7/2013 | Liu | |

* cited by examiner

ISOLATION RINGS FOR PACKAGES AND THE METHOD OF FORMING THE SAME

PRIORITY CLAIM AND CROSS-REFERENCE

This application is a continuation of U.S. patent application Ser. No. 14/189,584 entitled "Isolation Rings for Packages and the Method of Forming the Same," filed on Feb. 25, 2014 which application is a divisional of U.S. patent application Ser. No. 13/485,527, entitled "Isolation Rings for Blocking the Interface between Package Components and the Respective Molding Compound," filed on May 31, 2012, now U.S. Pat. No. 8,710,681, which applications are incorporated herein by reference.

BACKGROUND

In the packaging of integrated circuits, device dies are bonded onto package components such as package substrates in a package substrate strip. The package substrates include metal connections that are used to route electrical signals between opposite sides of the respective package substrates. The dies may be bonded onto one side of a package substrate strip using flip chip bonding, and a reflow is performed to melt the solder balls that interconnect the dies and the package substrates.

After the bonding of the device dies onto the package substrate strip, a molding compound is molded onto the device dies and the package substrate strip. The package substrate strip is then sawed apart into a plurality of packages. Although the molding materials are generally moisture proof, the moisture may still penetrate into the resulting packages.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A package and a method of forming the same are provided in accordance with various exemplary embodiments. The intermediate stages of forming the package are illustrated. The variations of the embodiments are discussed. Throughout various views and illustrative embodiments, like reference numbers are used to designate like elements.

Figure 1:
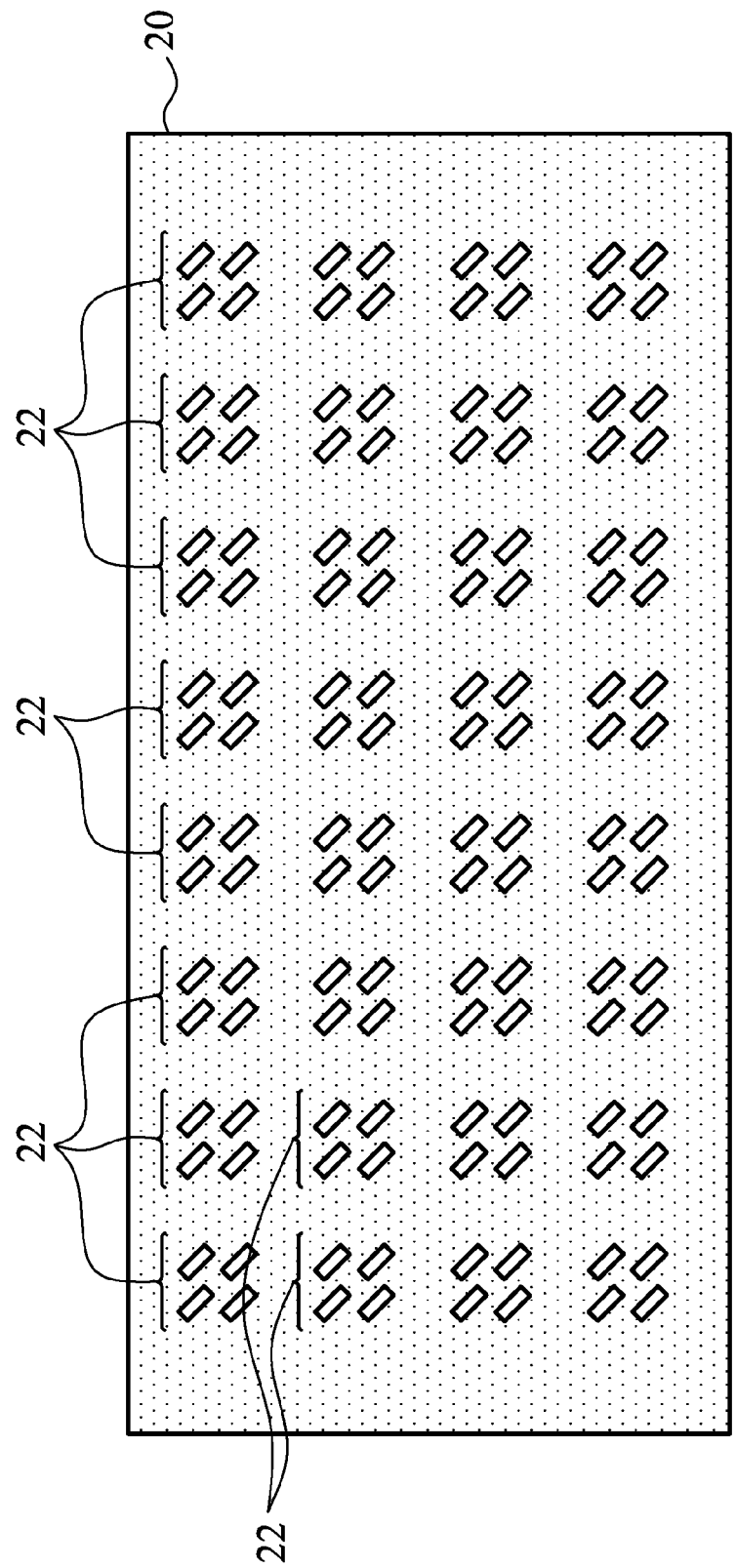
FIGS. 1 through 5B are top views and cross-sectional views of intermediate stages in the formation of packages in accordance with some exemplary embodiments.

FIG. 1 illustrates a top view of a package component 20. In some embodiments, package component 20 is a package substrate strip, and hence is referred to as package substrate strip 20 hereinafter, although package component 20 may also be another type of package component such as an interposer wafer, a device wafer, or the like. In the embodiments wherein package component 20 is a package substrate strip, package substrate strip 20 includes a plurality of package substrates 22, which are identical to each other. In some embodiments, package substrates 22 are distributed uniformly in one or both of the illustrated X and Y directions, and may have the layout of an array.

Package substrates 22 may be laminate substrates, which include a plurality of dielectric films 23 (shown in FIG. 2B) adhered together through lamination, or may be build-up substrates. Dielectric films may comprise composite materials that are mixed with glass fiber and/or resin. Metal traces 28 and vias 30 (FIG. 2B) are formed in laminate dielectric films 23. As also shown in FIG. 2B, electrical connectors 24 are formed on a surface of package substrates 22, and are connected to electrical connectors 26 that are on the opposite side of the respective package substrate 22 through metal traces 28. In some embodiments, electrical connectors 24 are metal traces, which are used for forming Bump-On-Trace (BOT) connections. In alternative embodiments, electrical connectors 24 are metal pads, metal pillars, composite connectors comprising metal pillars and solder caps, or the like.

Figure 2A:
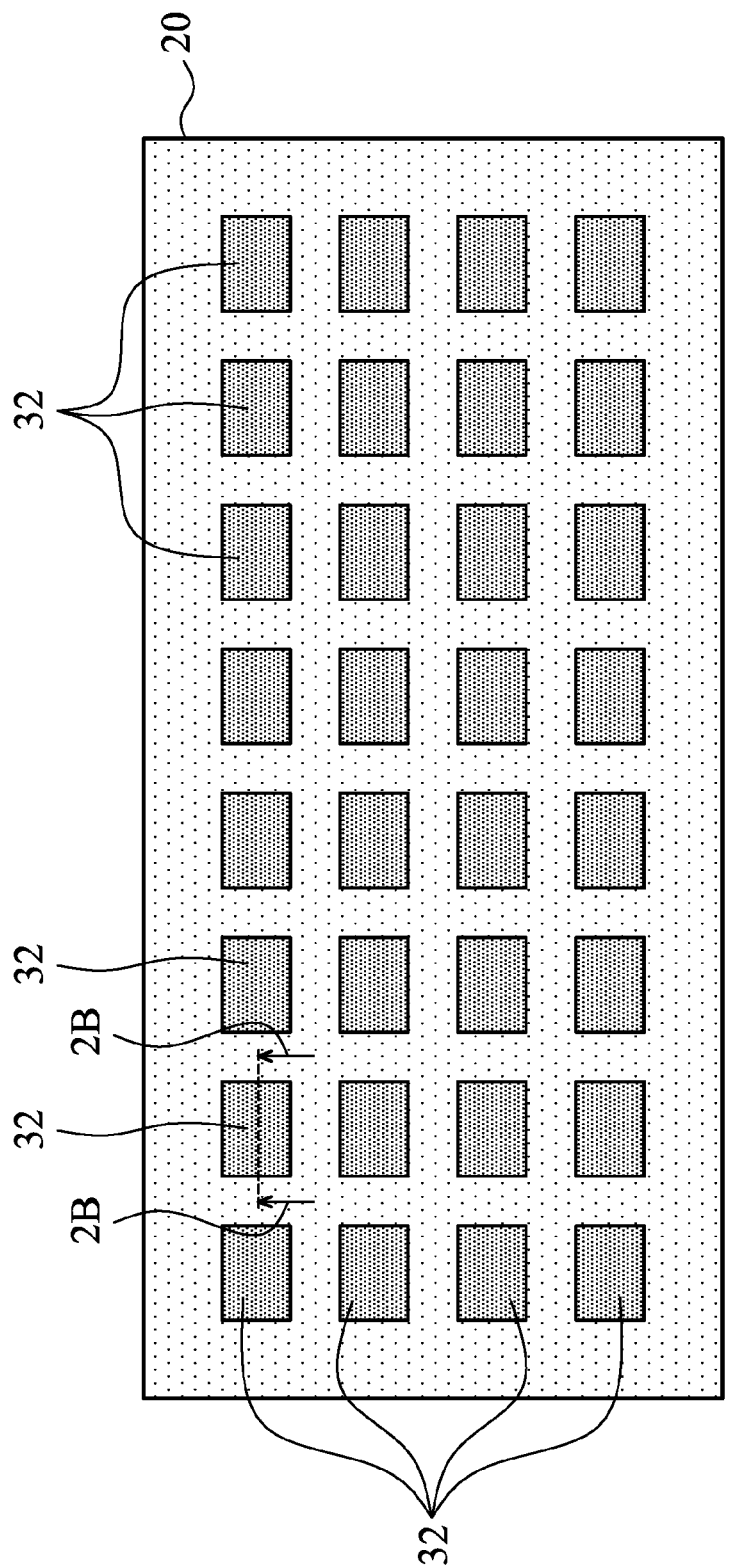
Figure 2B:
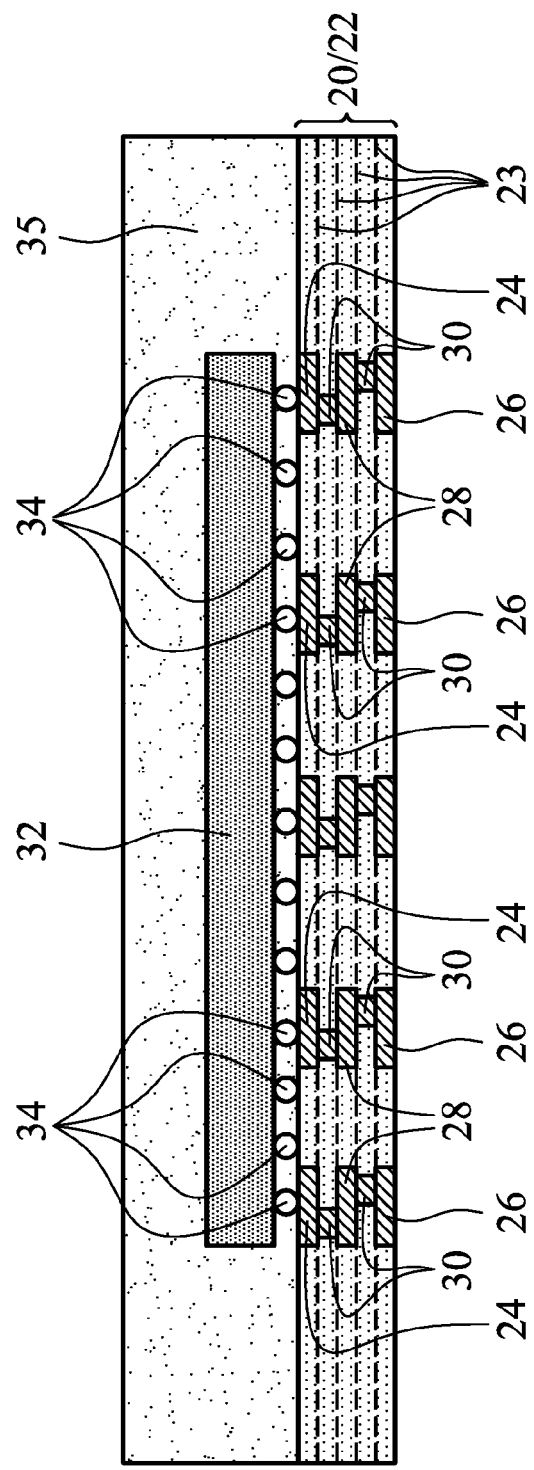

FIG. 2A illustrates a top view showing the bonding of package components 32 onto package substrates 22 in FIG. 1. FIG. 2B illustrates a cross-sectional view of FIG. 2A, wherein the cross-sectional view is obtained from the plane crossing line 2B-2B in FIG. 2A. In some embodiments, package components 32 are dies (such as device dies comprising transistors), packages, or the like. Referring to FIG. 2B, the bonding may be performed through solder bonding, wherein electrical connectors 34 of package components 32 are solder balls. In some exemplary embodiments, the bonding is a BOT bonding.

As also shown in FIG. 2B, after the bonding of package components 32 onto package substrates 22, polymer 35 is dispensed to mold package components 32 and package substrates 22. In some embodiments, polymer 35 is a molding compound, a molding underfill, an epoxy, or the like. An underfill (not shown) may be dispensed into the gaps between package components 32 and package substrates 22. Alternatively, no underfill is dispensed. Instead, polymer 35 is a molding underfill that is also disposed into the gaps besides molding package components 32. Polymer 35 is then cured and solidified.

Figure 3A:
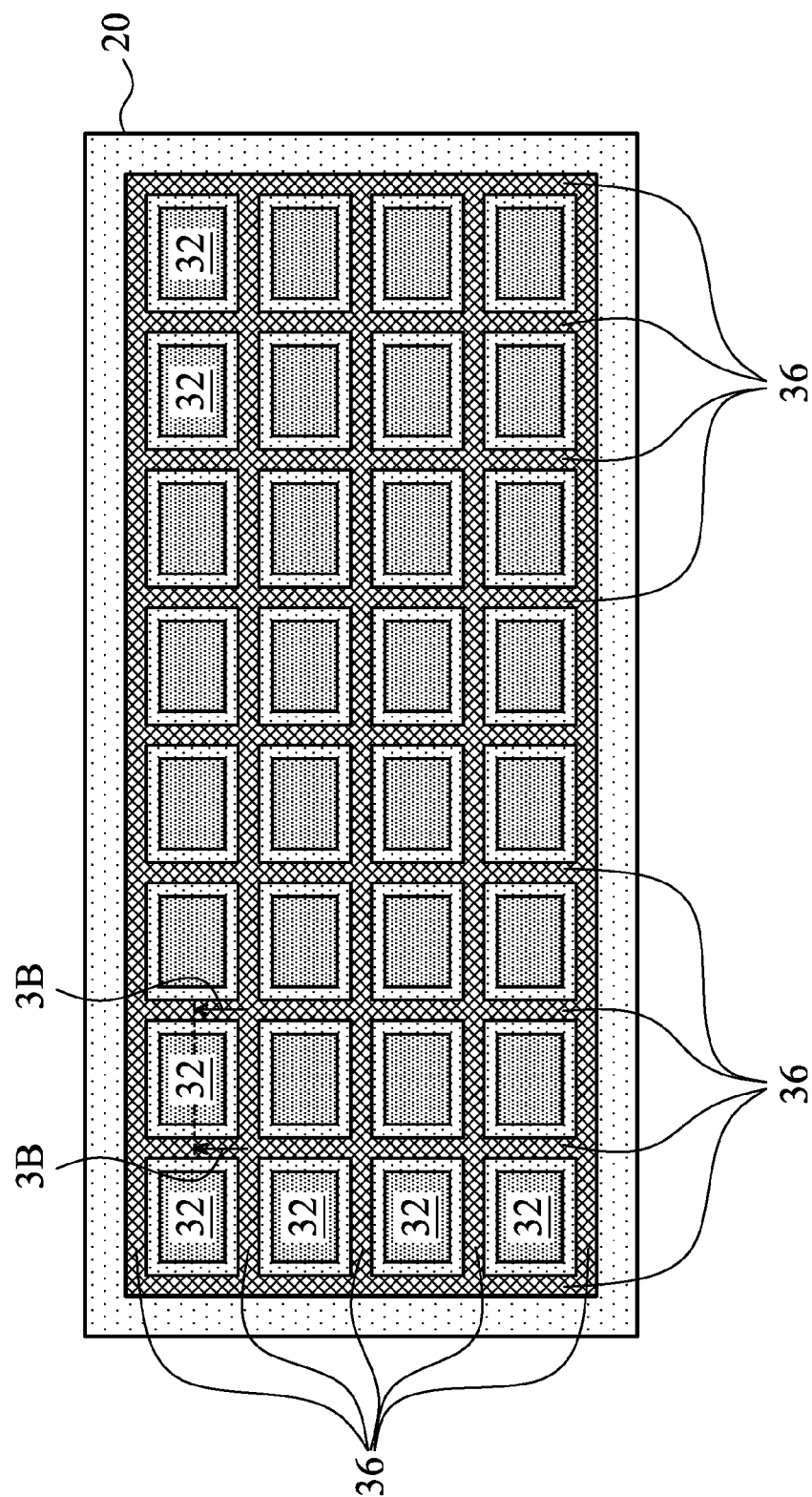
Figure 3B:
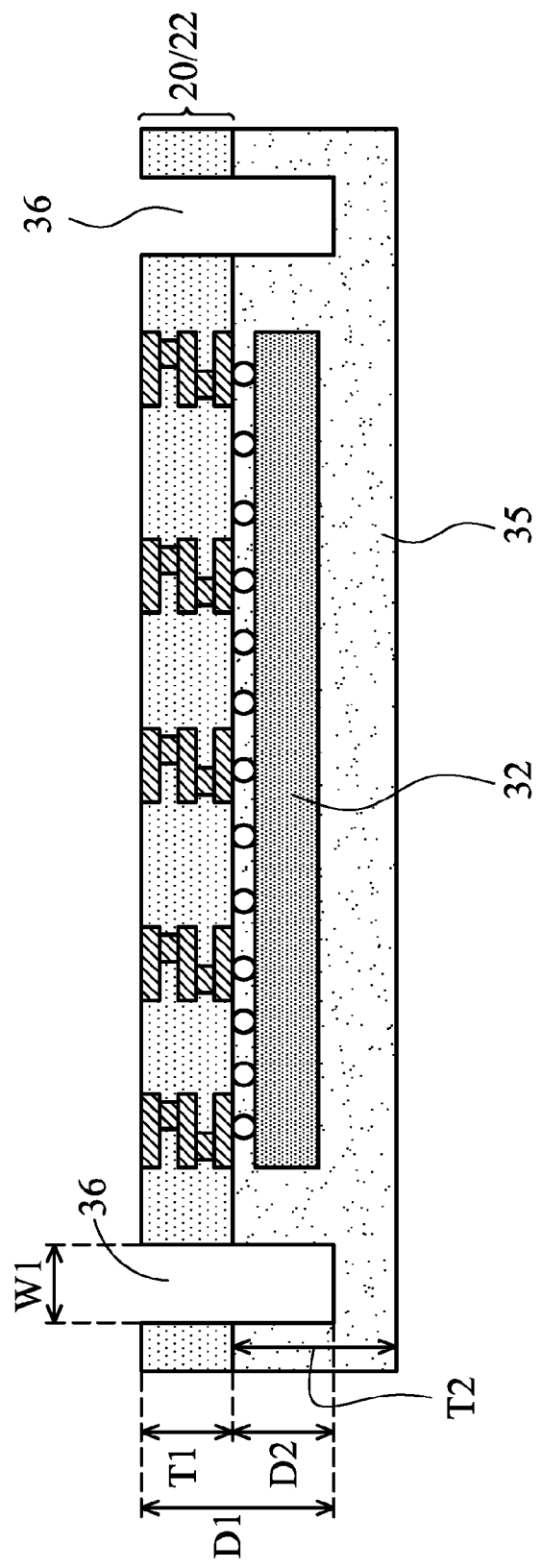

Referring to FIGS. 3A and 3B, a grooving is performed on package substrate strip 20 to form trenches 36. The grooving may be performed using a blade, a laser beam, or the like. Referring to FIG. 3A, trenches 36 are formed between package substrates 22, and separate package substrates 22 from each other. Trenches 36 may form a grid. FIG. 3B illustrates a cross-sectional view of the structure shown in FIG. 3A, wherein the cross-sectional view is obtained from the plane crossing line 3B-3B in FIG. 3A. As shown in FIG. 3B, trenches 36 penetrate through package substrate strip 20, extend into polymer 35, and stop at an intermediate level of polymer 35. Accordingly, depth D1 of trenches 36 is at least greater than thickness T1 of package substrate strip 20. Furthermore, depth D2, which is the depth of the portions of trenches 36 in polymer 35, may be greater than about 20 percent thickness T2 of polymer 35, and may be between about 20 percent and about 80 percent thickness T2. Width W1 of trenches 36 may be between about 1,000 μm and about 5,000 μm.

Figure 4A:
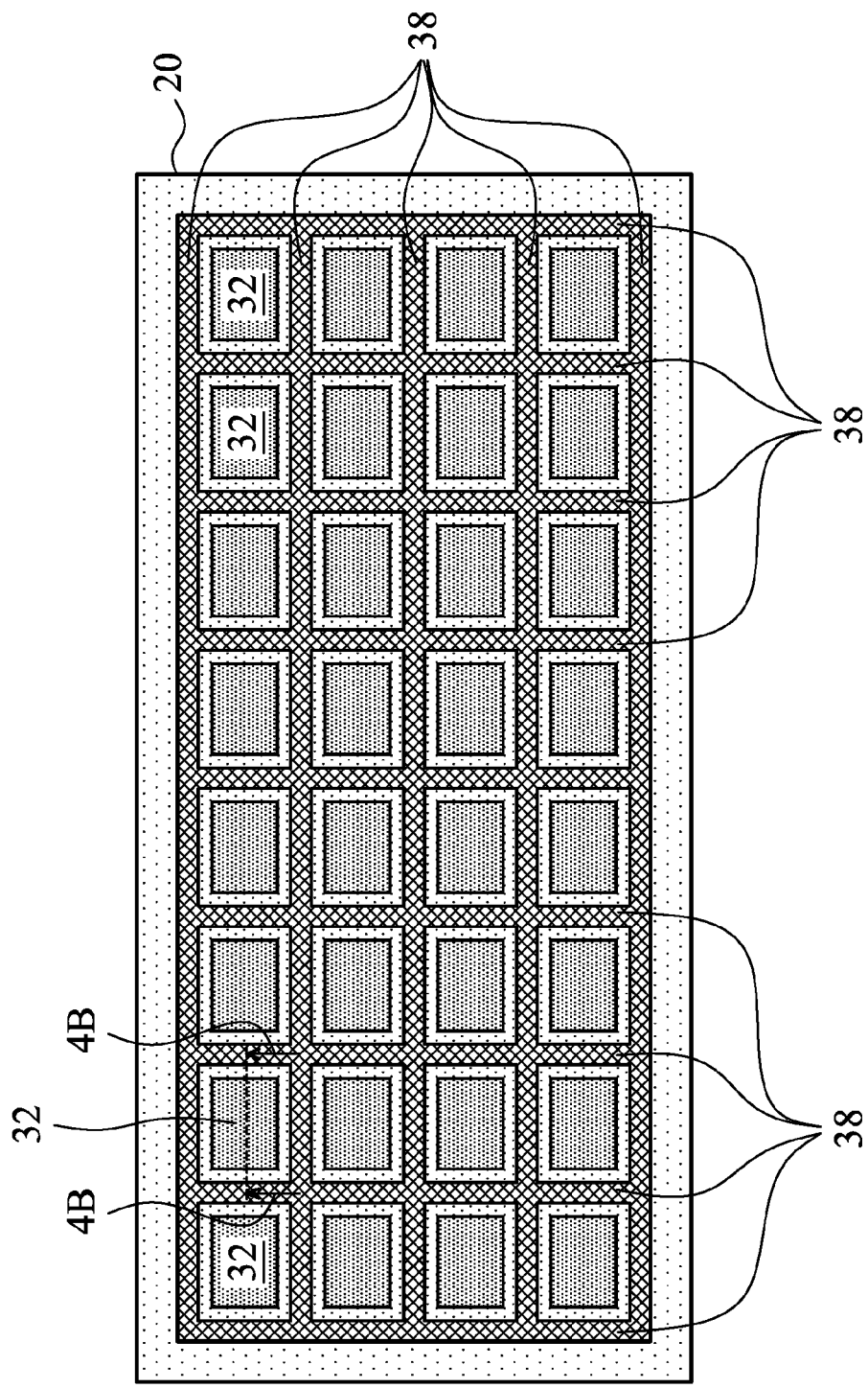
Figure 4B:
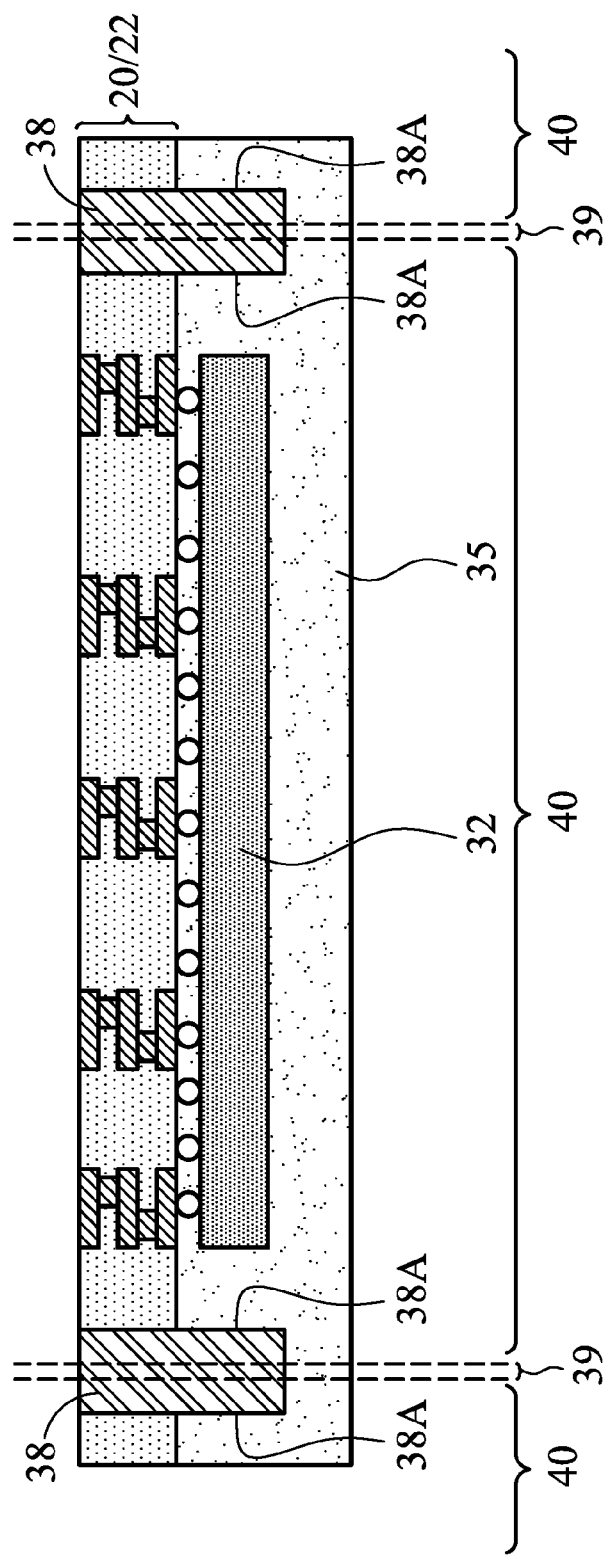
Figure 5A:
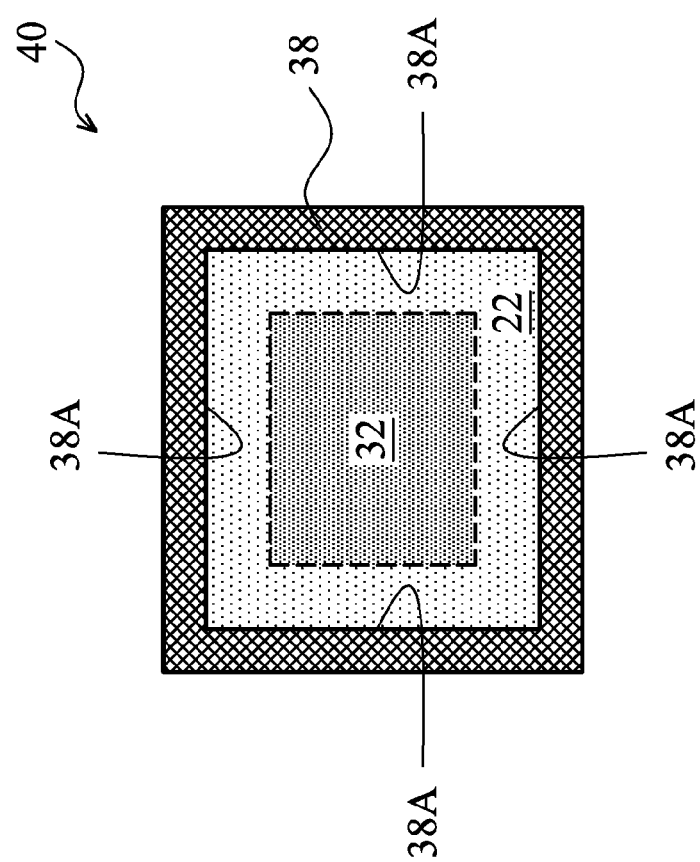
Figure 5B:
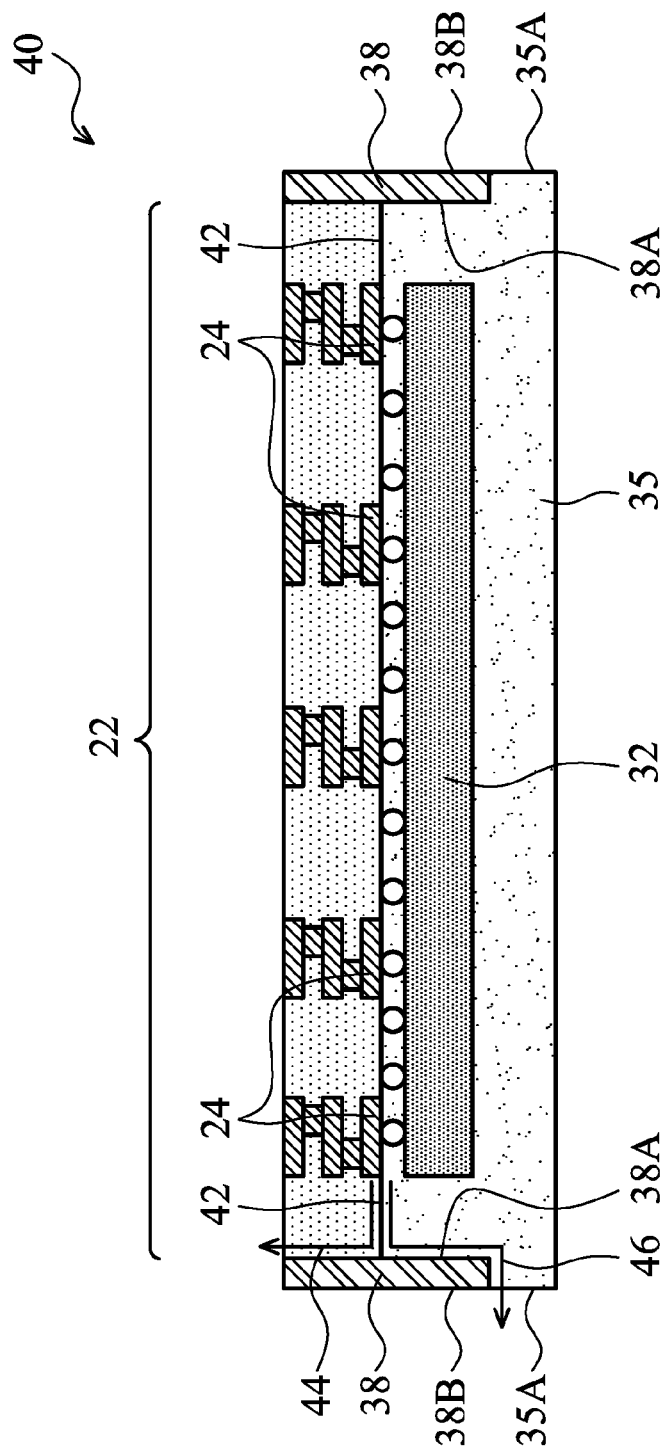

An isolation material is filled into trenches 36, and is cured (solidified) to form isolation regions 38. The resulting structure is shown in FIGS. 4A and 4B. FIG. 4B illustrates a cross-sectional view of the structure shown in FIG. 4A, wherein the cross-sectional view in FIG. 4B is obtained from the plane crossing line 4B-4B in FIG. 4A. The top surface of isolation regions 38 may be slightly higher than, substantially level with, or lower than, the top surfaces of package substrates 22. When filled into trenches 36, isolation material 38 may be a liquid or a gel, which has a viscosity low enough to fill into the micro-voids (not shown) in polymer 35 (FIG. 5B). Isolation regions 38 may be a polymer, a resin, or the like. In some exemplary embodiments, isolation material 38 is a solder resist such as comprising Alkyd resin, acrylated epoxy resin, methacrylated epoxy resin, or the like. After the curing, isolation regions 38 may have a density greater than the density of the cured polymer 35 in accordance with some embodiments. For example, the ratio of the density of isolation regions 38 to the density of polymer 35 may be greater than about 3 volume percent. The ratio of the density of isolation regions 38 to the density of polymer 35 may be between about 97 volume percent and about 100 volume percent in accordance with some embodiments. The dispensing of the isolation material may be performed, for example, through stencil printing.

Next, as also shown in FIG. 4B, a die saw is performed to saw the structure in FIGS. 4A and 4B into a plurality of packages 40. Kerf lines 39 are between opposite edges 38A of isolation regions 38. After the die sawing, there are remaining portions of isolation regions 38 on opposite sides of kerf lines 39. FIGS. 5A and 5B illustrate a top view and a cross-sectional view, respectively, of package 40. As shown in FIG. 5A, isolation regions 38 are located at the peripheral region of package 40. It is appreciated that although isolation regions 38 are referred to using a plural form, isolation regions 38 may be parts of a same continuous ring, as shown in FIG. 5A. The inner edges 38A of isolation regions 38 are in contact with the edges of package component 22.

Referring to FIG. 5B, outer edges 38B of isolation regions 38 also act as the edges of package 40. Outer edges 38B are aligned to edges 35A of polymer 35. Inner edges 38A of isolation regions 38 are opposite to outer edges 38B, and are in contact with both package substrate 22 and polymer 35. Furthermore, inner edges 38A are in contact with interface 42 between polymer 35 and package substrate 22.

In some embodiments, isolation regions 38 form a ring encircling and contacting interface 42. Interface 42 is likely to be the weak part in which moisture and detrimental chemical gases may pass through. For example, the moisture may travel from open air, through interface 42, and reach the internal features such as electrical connectors 24. It is realized that the resistance to the penetration of the moisture increases when the length of the traveling path of the moisture increases. Accordingly, as shown in FIG. 5B, assuming if isolation regions 38 are not formed, moisture may travel from open air to electrical connectors 24 through paths 45. When isolation regions 38 are formed, moisture may travel from open air to electrical connectors 24 through paths 46, which are longer than paths 45. Since paths 46 are longer than paths 45, the resulting package 40 has increased resistance to the penetration of moisture and the detrimental chemical gases than in structures that do not have isolation regions 38. As a result, since electrical connectors suffer less from the moisture and detrimental chemicals, the risk of short circuits between neighboring electrical connectors 24 is reduced. For example, the short circuits may be the result of the formation of dendrites between neighboring electrical connectors 24, and the undesirable dendrites may further be formed due to the oxidation of metal ions of electrical connectors 24, the migration of the oxidized metal ions along interface 42, and the reduction of the migrated metal ions.

Figure 6:
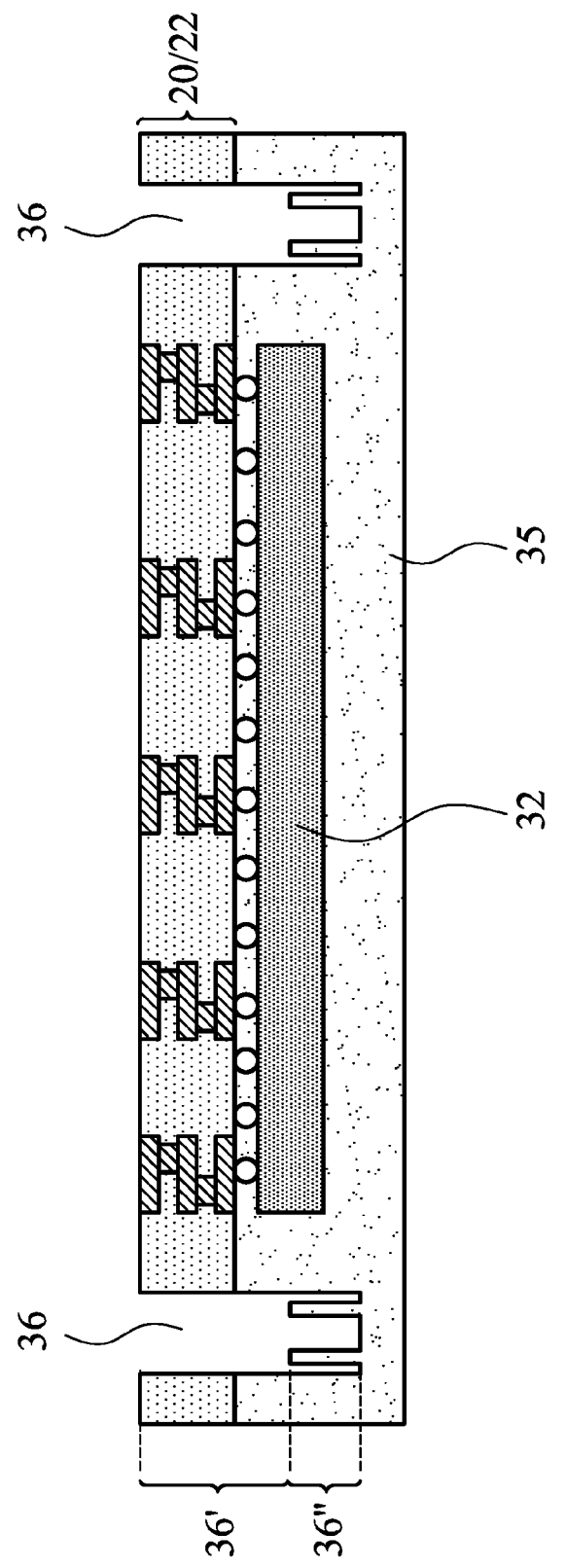
FIGS. 6 through 8 illustrate the formation of packages in accordance with some alternative exemplary embodiments.
Figure 7:
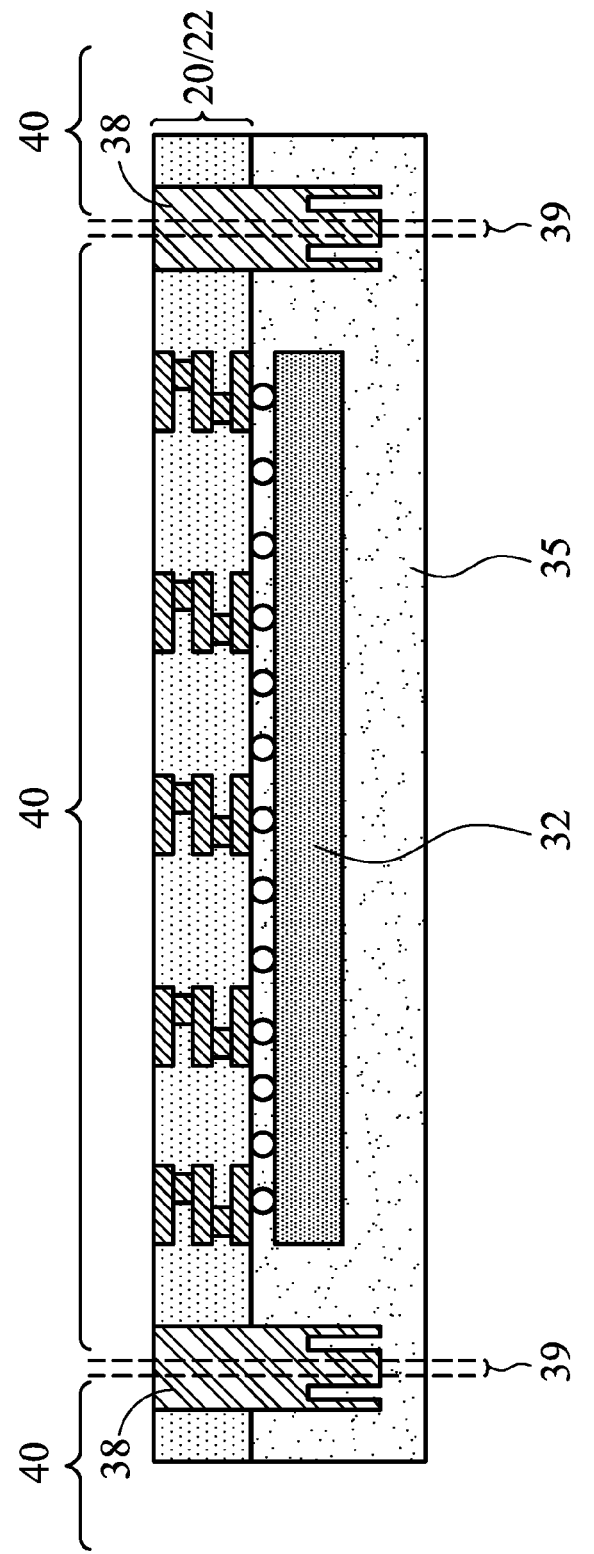

FIGS. 6 and 7 illustrate the formation of package 40 in accordance with alternative embodiments. In FIG. 6, trenches 36 include wide portions 36' and narrow portions 36", which are narrower than wide portions 36'. In the formation of trenches 36, wide portions 36' are first formed, wherein wide portions 36' may extend from the top surface of package substrate 22 into polymer 35. Wide portions 36' may form a grid since wide trenches 36' are parts of trenches 36, which forms a grid, as shown in FIG. 3A. Next, a plurality of narrow trenches 36" is formed to extend from the bottom of wide portions 36' deeper into polymer 35. Next, as shown in FIG. 7, isolation material 38 is dispensed into trenches 36 to form isolation regions 38, which also include wide portions and narrow portions. A die saw step is then performed to cut package substrate strip 20, isolation regions 38, and polymer 35 into packages 40. The respective kerf lines 39 of the sawing are illustrated.

Figure 8:
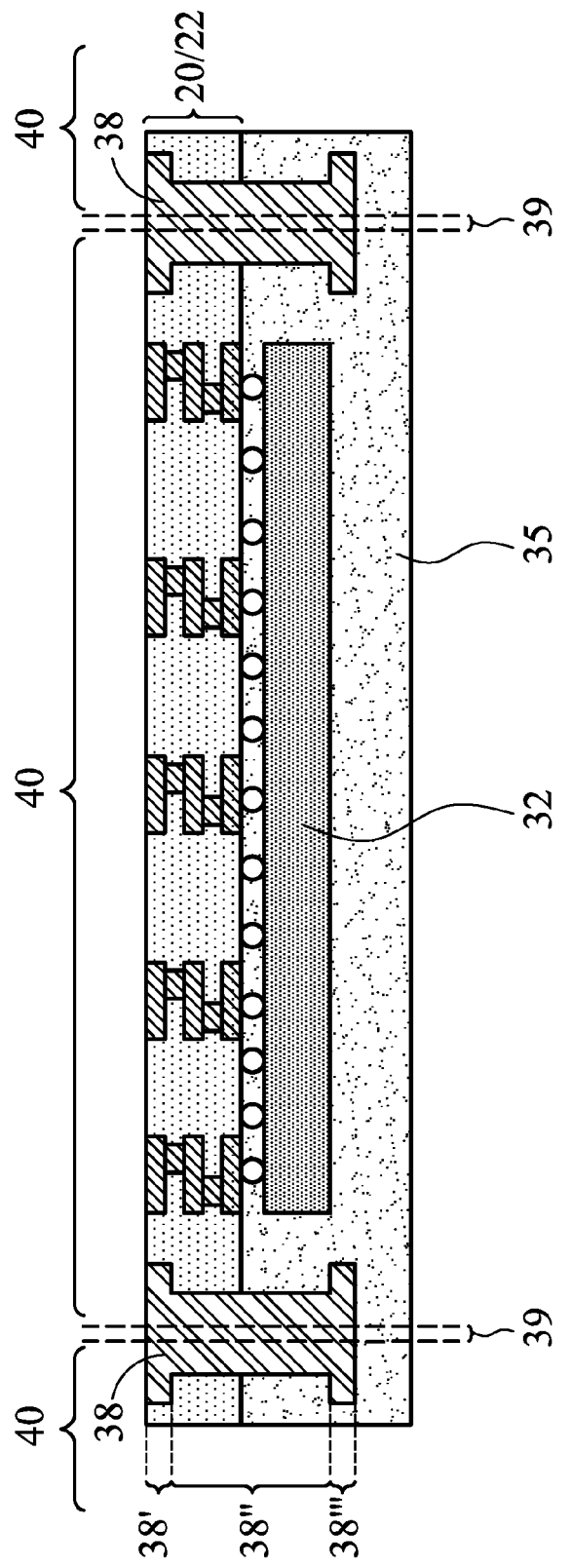

FIG. 8 illustrates the formation of package 40 in accordance with further embodiments. In these embodiments, isolation regions 38 include wide portions 38', narrow portions 38", and additional wide portions 38'''. In the formation of the trench of isolation regions 38, the trenches for forming portions 38' and 38" may be formed before the sawing of package substrate strip 20, and the trenches for forming portions 38''' may be formed after the sawing. The filling of the isolation material 38 may be performed after the die saw.

In accordance with embodiments, a device includes a first package component, and a second package component underlying, and bonded to, the first package component. A molding material is disposed under the first package component and molded to the first and the second package components, wherein the molding material and the first package component form an interface. An isolation region includes a first edge, wherein the first edge of the isolation region contacts a first edge of the first package component and a first edge of the molding material. The isolation has a bottom lower than the interface.

In accordance with other embodiments, a device includes a package substrate, and a device die underlying, and bonded to, the package substrate. A molding compound is disposed under the package substrate and molded to the package substrate and the device die. A polymer encircles the package substrate and contacts edges of the package substrate. The polymer extends from a top surface of the package substrate to a level lower than a top surface of the molding compound.

In accordance with yet other embodiments, a method includes bonding a first package component to a second package component, molding a molding material to the first and the second package components, and forming a trench penetrating through the first package component. The trench extends into the molding material. An isolation material is filled into the trench to form an isolation region. The isolation region and the molding material are sawed to form a package, wherein the package includes a portion of the isolation region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    bonding a first package component with a second package component;
    encapsulating the second package component in a molding material;
    forming a trench in the first package component, with the molding material exposed to the trench, wherein the forming the trench comprises:
        performing a first grooving to form a wide portion of the trench, wherein the wide portion extends from a surface of the first package component into the molding material; and
        performing a second grooving to form a first narrow portion extending from a bottom of the wide portion into the molding material, wherein the first narrow portion is narrower than the wide portion;
    filling an isolation material into the trench to form an isolation region; and
    sawing through the isolation region and the molding material to form a package.

2. The method of claim 1, wherein the trench extends into the molding material, and in the package, the isolation region forms a ring encircling the second package component and a portion of the first package component.

3. The method of claim 1, wherein the first package component comprises a package substrate that is comprised in a package substrate strip, and the method further comprises:
    bonding a plurality of second package components onto a plurality of package substrates in the package substrate strip;
    forming a plurality of trenches in the package substrate strip, wherein the plurality of trenches forms a grid, and the isolation material is filled into the plurality of trenches to form a plurality of isolation regions; and
    sawing the package substrate strip and the isolation material as a plurality of packages.

4. The method of claim 1, wherein the filling the isolation material comprises:
    dispensing the isolation material that is in a liquid form into the trench; and
    curing the isolation material.

5. The method of claim 1, wherein during the sawing, the isolation region comprises remaining portions on opposite sides of a kerf generated by the sawing.

6. The method of claim 1 further comprising, before the forming the trench, filling an underfill into a gap between the first package component and the second package component.

7. The method of claim 1, wherein the forming the trench further comprises performing a third grooving to form a second narrow portion extending from the bottom of the wide portion into the molding material, wherein the second narrow portion is narrower than the wide portion, wherein when the isolation region is sawed through, a kerf of the sawing is spaced apart, and is between, the first and the second narrow portions of the trench.

8. A method comprising:
    bonding a plurality of dies onto a plurality of package substrates, wherein the plurality of package substrates is in a package substrate strip;
    encapsulating the plurality of dies with a molding compound;
    cutting the package substrate strip to form a plurality of trenches, wherein one of the plurality of trenches is formed by:
        forming a first trench extending into the molding compound; and
        forming a second trench extending from a bottom of the first trench into the molding compound, wherein the second trench is narrower than the first trench;
    filling the plurality of trenches with an isolation material; and
    sawing the isolation material to separate the package substrate strip and the plurality of dies into a plurality of packages.

9. The method of claim 8, wherein the plurality of trenches penetrates through the package substrate strip, and the isolation material extends into the molding compound.

10. The method of claim 9, wherein the isolation material extends to an intermediate level between a first surface and a second surface of the molding compound, and wherein the first surface forms an interface with the package substrate strip.

11. The method of claim 8, wherein in the sawing the isolation material, a middle portion of the isolation material in one of the plurality of trenches is sawed-through to form a kerf, and wherein the isolation material further comprises additional portions in the one of the plurality of trenches, and wherein the additional portions are on opposite sides of the kerf.

12. The method of claim 8, wherein the cutting is performed using a blade.

13. The method of claim 8, wherein the cutting is performed using a laser beam.

14. The method of claim 8 further comprising, before the forming the plurality of trenches, filling an underfill into gaps between the plurality of dies and the package substrate strip.

15. The method of claim 8, wherein the forming the one of the plurality of trenches further comprises forming a third trench extending from the bottom of the first trench into the molding compound, wherein the third trench is narrower than the first trench, wherein during the sawing, portions of the molding compound filling the second trench and the third trench are spaced apart from a kerf of the sawing.

16. A method comprising:
    encapsulating a die with a molding compound, wherein the die is bonded to a first surface of a package substrate;
    grooving the package substrate from a second surface of the package substrate, with the first surface and the second surface being opposite to each other, wherein trenches formed by the grooving encircle a center portion of the package substrate, and wherein the trenches penetrate through the package substrate to extend into the molding compound, and the trenches comprise portions level with the die, and the trenches further extend deeper into the molding compound beyond the die; and filling the trenches with an isolation material.

17. The method of claim 16 further comprising sawing the isolation material and the molding compound, wherein remaining portions of the isolation material left by the sawing encircles a central part of the package substrate.

18. The method of claim 17, wherein after the sawing, remaining portions of the isolation material forms a ring, and wherein outer edges of the ring are aligned to respective edges of the package substrate.

19. The method of claim 16, wherein the isolation material has a density higher than a density of the molding compound.

20. The method of claim 16, wherein the grooving comprises:

performing a first grooving to form a wide portion for one of the trenches, wherein the wide portion extends from a surface of the package substrate into the molding compound; and performing a second grooving to form a narrow portion extending from a bottom of the wide portion into the molding compound, wherein the narrow portion is narrower than the wide portion.

* * * * *